United States Patent [19]
Patel

[11] Patent Number: 5,396,403
[45] Date of Patent: Mar. 7, 1995

[54] HEAT SINK ASSEMBLY WITH THERMALLY-CONDUCTIVE PLATE FOR A PLURALITY OF INTEGRATED CIRCUITS ON A SUBSTRATE

[75] Inventor: Chandrakant Patel, Fremont, Calif.

[73] Assignee: Hewlett-Packard Company, Palo Alto, Calif.

[21] Appl. No.: 88,288

[22] Filed: Jul. 6, 1993

[51] Int. Cl.⁶ .............................................. H05K 7/20
[52] U.S. Cl. .................................... 361/705; 257/713; 361/719
[58] Field of Search .................... 174/16.3, 52.4; 439/485; 165/80.3, 185; 257/703, 706, 711, 712, 713, 724, 796; 361/688, 689, 690, 702, 703–705, 719, 722, 736, 749, 752

[56] References Cited

U.S. PATENT DOCUMENTS

| | | | |
|---|---|---|---|
| 4,034,468 | 7/1977 | Koopman | 29/628 |
| 4,340,902 | 7/1982 | Honda et al. | 357/74 |
| 4,517,624 | 5/1985 | Wessely | 361/387 |
| 4,521,829 | 6/1985 | Wessely | 361/387 |
| 4,531,146 | 7/1985 | Cutchaw | 357/82 |
| 4,546,410 | 10/1985 | Kaufman | 361/705 |
| 4,563,725 | 1/1986 | Kirby | 361/388 |
| 4,612,601 | 9/1986 | Watari . | |
| 4,612,978 | 9/1986 | Cutchaw | 165/104.33 |
| 4,658,331 | 4/1987 | Berg | 361/387 |
| 4,879,629 | 11/1989 | Tustaniwskyj et al. | 361/385 |
| 4,914,551 | 4/1990 | Anschel | 361/719 |
| 4,926,242 | 5/1990 | Itoh et al. | 357/81 |
| 4,933,747 | 6/1990 | Schroeder | 357/82 |
| 4,964,458 | 10/1990 | Flint et al. | 165/80.4 |
| 5,094,769 | 3/1992 | Anderson | 252/71 |
| 5,097,387 | 3/1992 | Griffith | 361/385 |
| 5,109,317 | 4/1992 | Miyamoto | 361/705 |
| 5,165,986 | 11/1992 | Gardner | 428/209 |
| 5,168,348 | 12/1992 | Chu et al. | 257/713 |
| 5,177,667 | 1/1993 | Graham et al. | 361/385 |
| 5,237,203 | 8/1993 | Massaron | 257/688 |
| 5,247,424 | 9/1993 | Harris | 361/749 |

FOREIGN PATENT DOCUMENTS

| | | |
|---|---|---|
| 0243710A2 | 11/1987 | European Pat. Off. . |
| 0368743A2 | 5/1990 | European Pat. Off. . |
| 0488641A1 | 6/1992 | European Pat. Off. . |
| 0533067A1 | 3/1993 | European Pat. Off. . |
| 2246472A | 1/1992 | United Kingdom . |
| WO79/01012 | 11/1979 | WIPO . |

OTHER PUBLICATIONS

Darveaux et al., "Thermal Analysis of a Multi-Chip Package Design", Journal of Electronic Materials, vol. 18, No. 2, 1988, pp. 267–274.

Darveaux et al., "Backside Cooling of Flip Chip Devices in Multichip Modules", ICMCM Proceedings '92, pp. 230–241.

*Primary Examiner*—Gerald P. Tolin

[57] ABSTRACT

A heat sink assembly for a multichip module. A thermally conductive plate is bonded to integrated circuit chips on a multichip module by indium solder. The plate in turn is thermally coupled to a heat sink such as finned aluminum by thermal paste. The plate is made of a material such as silicon carbide or copper-tungsten alloy having a relatively low coefficient of expansion to minimize mechanical stress resulting from lateral motion of the chips due to thermal expansion. Relatively low-power chips may be thermally coupled to the plate by thermal paste instead of being bonded by solder.

17 Claims, 4 Drawing Sheets

HEAT SINK ASSEMBLY WITH THERMALLY-CONDUCTIVE PLATE FOR A PLURALITY OF INTEGRATED CIRCUITS ON A SUBSTRATE

The present invention relates generally to heat sinks for electronic components and more particularly to a heat sink assembly that includes a thermally conductive plate sandwiched between a heat sink and a plurality of integrated circuit chips in a multi-chip module, coupled to the chips with an indium-based thermal interface and to the heat sink with thermal paste.

Modern electronic appliances such as computers have many hundreds of integrated circuits and other electronic components, most of which are mounted on printed circuit boards. Many of these components generate heat during normal operation. Components that are relatively big or that have a relatively small number of functions in relation to their size, as for example individual transistors or small scale integrated circuits, usually dissipate all their heat without a heat sink. The large physical sizes of such components, especially as compared with their active portions, limits their density on a circuit board sufficiently that there is enough room for any heat sinks that may be needed. Accordingly, any component that needs assistance in dissipating heat can have a heat sink of its own.

The term "heat sink" as used herein generally refers to a passive device, for example an extruded aluminum plate with a plurality of fins, that is thermally coupled to an electronic component to absorb heat from the component. The heat sink dissipates this heat into the air by convection.

As the state of the electronic arts has advanced, components have become smaller and smaller, to the extent that many thousands of them are now combined into a single integrated circuit chip. In addition, components are being made to operate faster and faster to provide the computing power that is increasingly being required of computers and other electronic devices. As the operating speed increases, so does the amount of heat which the components must dissipate. These factors have made it more difficult for many components to dissipate the heat they generate without the assistance of external heat sinks. At the same time, the increasing component density has made it impractical to provide individual heat sinks for the increasing numbers of components that need them. Accordingly, it has become necessary for many components to share one heat sink.

One widely-used method of increasing the speed of an electronic circuit is to reduce the lengths of the connecting wires. In part, this is being done by abandoning the older practice of enclosing each integrated circuit chip in a separate package in favor of mounting many chips next to each other on a single substrate. Such an assembly of chips and substrate is commonly referred to as a multi-chip module ("MCM"). The chips on an MCM are too small, and usually must be located too near one another on the MCM, to permit the use of separate heat sinks for the individual chips. Accordingly, in order to dissipate the heat generated by the chips on an MCM, it is necessary to use a single heat sink.

In one type of MCM, each chip is mechanically fixed to a common heat sink, for example by solder or glue. The chips are connected to the substrate through flexible wires, for example by tape automated bonding ("TAB") techniques. If the chips move laterally relative to each other as a result of different rates of expansion of the chips and the heat sink, the flexible wiring absorbs the motion. Thus, relative lateral motion of the chips does not subject either the chips or their electrical connections to significant mechanical stress.

Flexible wires have drawbacks. One such drawback is the relative complexity of the wiring assembly. Another is that parasitic effects of the wires effectively limit the speed at which the overall device can operate. Accordingly, for many applications it is necessary to mount the chips directly on the substrate by means of solder bumps. This is known as "flip-chip" mounting.

One technique for cooling an MCM in which the chips are soldered directly onto the substrate is to thermally couple the heat sink to the opposite side of the substrate from the chips. The heat then travels from the chips, through the solder bumps and the substrate, and into the heat sink. This technique is often inadequate, especially if the MCM includes high-power chips.

Fixing a single heat sink on top of all the chips in an MCM by means of a thin layer of epoxy or solder is the simplest approach, but in high-power circuits this has not been satisfactory. The solder bumps that make the electrical connections between the chips and the substrate are the weakest mechanical link in the MCM. When the chips are rigidly coupled to the heat sink, differences between the coefficients of expansion of the chips and the heat sink result in lateral movement of the chips relative to each other as the chips and the heat sink warm up. This lateral expansion puts mechanical stresses on the solder bumps and ultimately leads to failure of the electrical connections. In addition, if it becomes necessary to service the MCM, for example to replace one of the chips, removing the heat sink so as to get access to the chips is very difficult.

An alternative is to couple the chips to the heat sink by thermal paste. This solves the differential expansion problem because the paste permits the chips and the heat sink to slide laterally relative to each other without putting any stress on the solder bumps. However, the chips often are not all the same height above the substrate, for example because the chips themselves are of different thicknesses or because of variations in solder bump height or in flatness of the substrate. To compensate for these variations in height, a relatively thick layer of paste must be used. The thermal conductivity of paste is not as good as that of solder, and the result is inadequate heat transfer when high-power chips are involved.

There have been many attempts to solve the problem of dissipating heat developed by high-power integrated circuit chips in an MCM. By way of example, some approaches to this problem are discussed in the following references: Darveaux and Turlik, "Backside Cooling of Flip Chip Devices in Multichip Modules", *ICMCM Proceedings*, 1992, pp. 230–241; European Patent no. EO 0 368 743 A2, "High Performance Integrated Circuit Chip Package and Method of Making Same", issued in the names of Turlik et al., May 16, 1990; U.S. Pat. No. 4,034,468, issued to Koopman on Jul. 12, 1977; U.S. Pat. No. 5,094,769, issued to Anderson, Jr., et al., on Mar. 10, 1992; and Darveaux et al., "Thermal Analysis of a Multi-Chip Package Design", *Journal of Electronic Materials*, Vol. 18, No. 2 (1989), pp. 267–274. Some of these solutions are mechanically complex, or are expensive, or make it difficult or impossible to rework or service the MCM. For these and other reasons, none of the prior approaches has adequately solved the problem.

From the foregoing it will be apparent that there is still a need for a way to adequately dissipate heat from all the integrated circuit chips in an MCM in the limited physical space that is available without imposing mechanical stresses that can lead to failure.

SUMMARY OF THE INVENTION

The present invention provides a single heat sink assembly that adequately dissipates heat generated by all the chips in an MCM without imposing mechanical stresses that can cause the MCM to fail. A heat sink assembly embodying the invention is mechanically simple, economical, easy to install, and easy to remove if it becomes necessary to rework the MCM.

Briefly and in general terms, a heat sink assembly according to the invention includes a thermally conductive plate, an interface such as indium solder to bond the plate to the various chips of an MCM, a heat sink, and thermal paste between the heat sink and the plate. The MCM is clamped onto the heat sink with the plate sandwiched between the chips and the heat sink. The indium solder establishes good thermal connections between the chips and the plate, and the plate has a relatively low coefficient of expansion which minimizes relative lateral motion of the chips and resulting mechanical stress on solder bumps connecting the chips to the substrate. The thermal paste, for example metal or metal oxide particles in silicone oil, conducts the heat from the plate to the heat sink.

The thermally conductive plate is made of a material such as silicon carbide or an alloy of copper and tungsten with a relatively low coefficient of expansion that does not greatly differ from that of the chips themselves.

In some instances all the chips are given a metallized upper surface that bonds readily with indium solder. In other cases some of the chips are not provided with such a metallized surface, and thermal paste is used to thermally couple the plate to any such chips. For example, it may be desired to solder only the high-power chips to the plate, in which case only the high-power chips are given a metallized upper surface.

A single plate may be used for all the chips on the MCM or the plate may be segmented, each segment contacting different ones of the chips.

The heat sink may be clamped to the MCM in various ways. One way to do this is with a support plate that, together with the heat sink, forms a cavity that encloses the MCM and the thermally conductive plate. Screws or other suitable fasteners are used to fasten the support plate to the heat sink. A flat flexible cable establishes electrical communications between the MCM and an external circuit.

In an alternate embodiment suitable for an MCM in which chips are mounted on both sides of the substrate, two thermally conductive plates and two heat sinks are used, one for the chips on each side of the substrate. In this embodiment the two heat sinks define a cavity in which the MCM and the plates are located, and all that is needed to clamp the entire assembly together is a fastener for fastening the two heat sinks together.

Other aspects and advantages of the invention will become apparent from the following detailed description, taken in conjunction with the accompanying drawings, illustrating by way of example the principles of the invention.

DESCRIPTION OF THE PREFERRED EMBODIMENT

Figure 1:
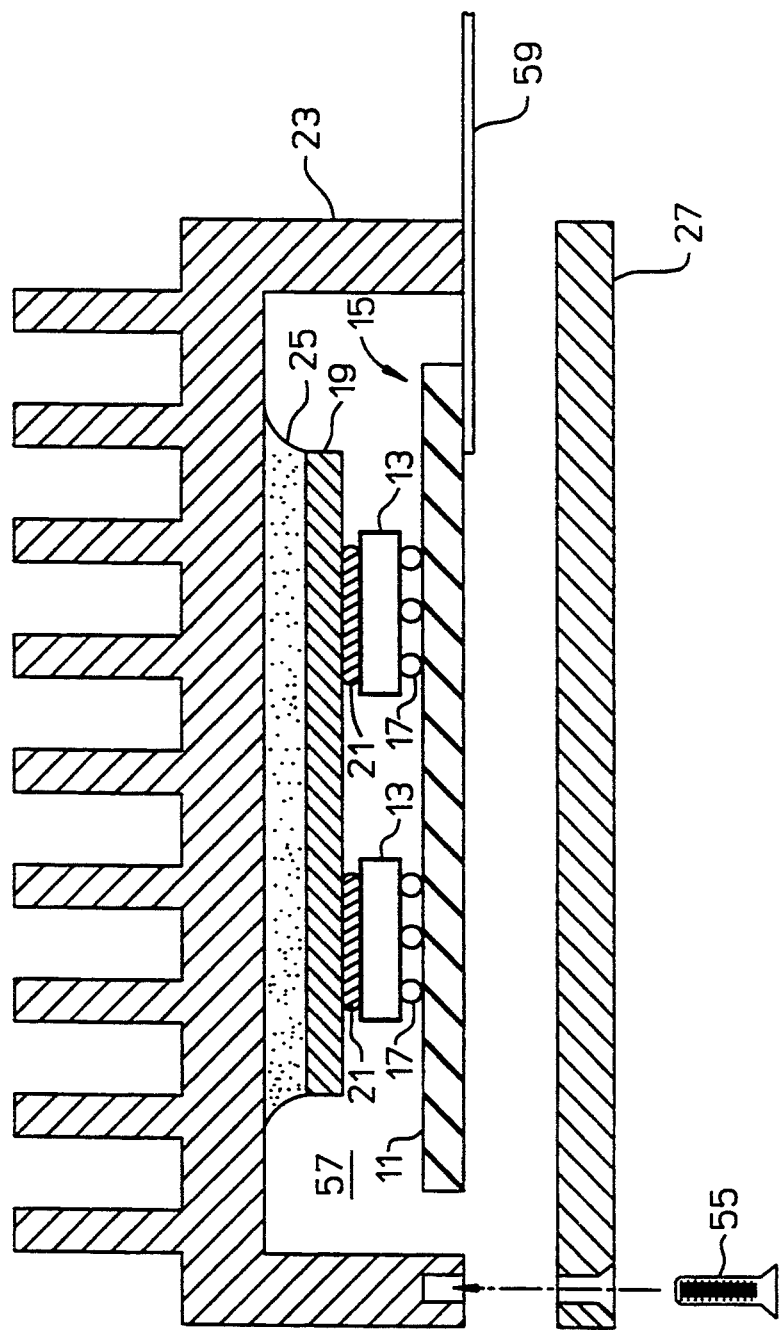
FIG. 1 is a cross-sectional view of a heat sink assembly according to the invention.

As shown in the drawings for purposes of illustration, the invention is embodied in a heat sink assembly that dissipates heat generated by all the chips in an MCM without imposing significant mechanical stress. Various ways of dissipating heat generated by the chips of an MCM have been tried, but these have resulted in high levels of mechanical stress from differential expansion and ultimate failure of the solder connections to the chips. Other attempts have been unduly costly or complex or have not adequately dissipated the heat from all the chips in a sufficiently limited physical space.

A heat sink assembly according to the invention includes a thermally conductive plate, indium solder or the like that bonds the plate to the chips, and a heat sink that is coupled to the plate by thermal paste. The heat sink is clamped to the MCM, sandwiching the plate in between. This heat sink assembly is mechanically simple and economical, it is easy to install and easy to remove for servicing or reworking the MCM, and it avoids excess mechanical stress that can lead to solder bump failure. Although the invention finds a primary application in a cooling system for MCMs, it has applications in other types of heat transfer systems as well.

FIG. 1 illustrates a preferred embodiment of a heat sink assembly according to the invention. The assembly is illustrated in combination with an MCM (multi-chip module) of the kind having a substrate 11 and a plurality of integrated circuit chips 13 mounted on a first surface 15 of the substrate by means of solder bumps 17 or the like. The assembly includes a thermally conductive plate 19; a first thermal interface 21 between the chips and the plate, operative to conduct heat from the chips to the plate; a heat sink 23; a second thermal interface 25 between the plate and the heat sink, operative to conduct heat from the plate to the heat sink; and clamping means such as a support plate 27 for clamping the MCM, the thermally conductive plate and the heat sink together.

Indium solder or the like is preferably used as the first thermal interface 21 to bond the chips 13 to the thermally conductive plate 19. Thermal paste or the like is preferably used as the second thermal interface 25 between the thermally conductive plate 19 and the heat sink 23.

The thermally conductive plate 19 preferably comprises silicon carbide, an alloy of copper and tungsten, or a similar material that bonds with indium solder and that has a relatively low coefficient of expansion that does not differ greatly from that of the chips 13.

Various substances may be used for the thermal paste. In general, pastes that comprise metal or metal oxide particles such as aluminum, aluminum nitride or silver in silicone oil have relatively good thermal conductivity (1.6 to 2.6 W/m-K) and have been found to give good results. One useful thermal paste is further described in U.S. Pat. No. 5,094,769 (Anderson, Jr., et al.) mentioned above.

The heat sink is preferably made of extruded aluminum or other suitable material. Optionally, a fan (not shown) may be attached to the heat sink fins to increase the rate of convective heat transfer.

The dimensions of the various elements are not critical and may be adjusted as desired according to such factors as the size and number of chips on the MCM and the thermal conductivities of the specific materials being used. For example, in one embodiment the thermally conductive plate is about 1.5 millimeters thick, the indium solder is about 0.15 millimeters thick, and the thermal paste is about 0.4 millimeters thick.

Figure 2:
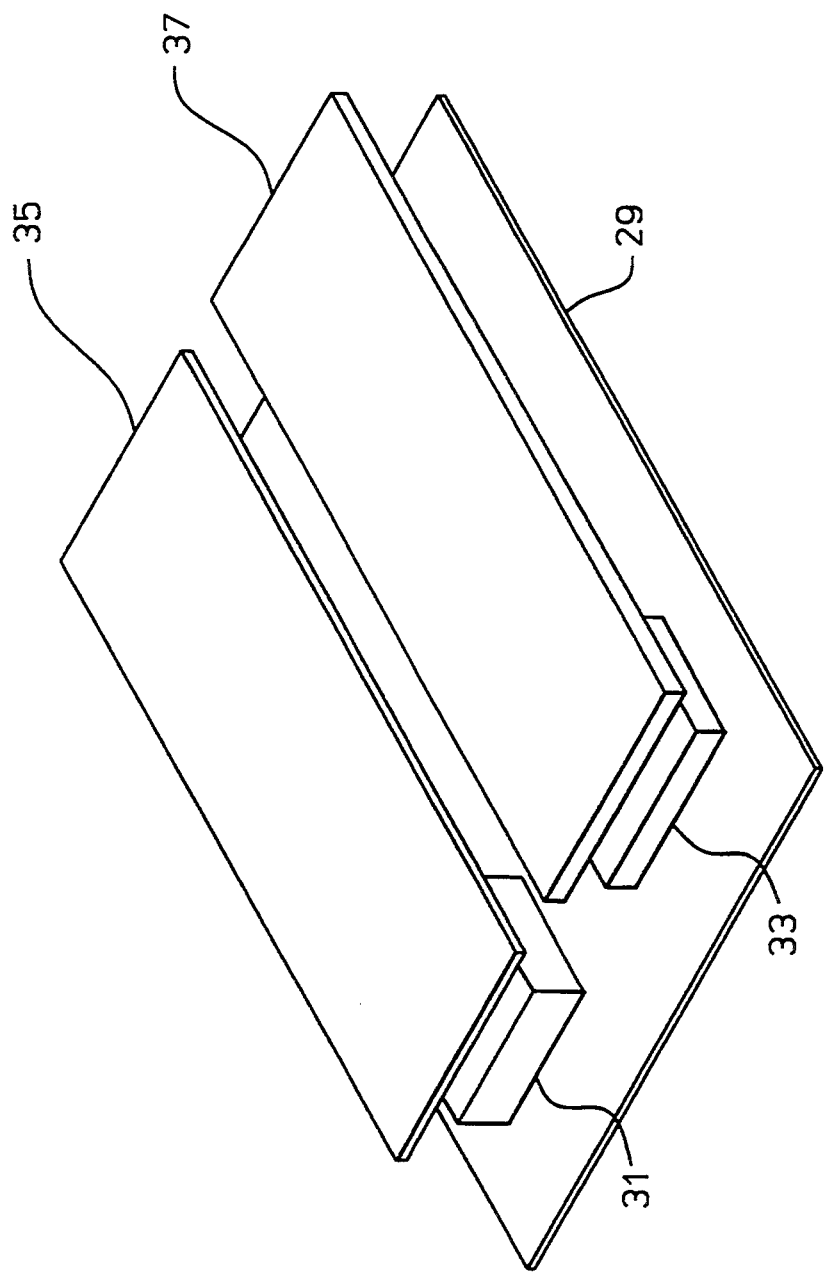
FIG. 2 is a perspective view of an assembly similar to the one shown in FIG. 1 (with the heat sink removed for clarity) and with a segmented thermally conductive plate.

In some cases it may be desirable to divide the thermally conductive plate into two or more segments. An example of this is shown in FIG. 2. A substrate 29, similar to the substrate 11 of FIG. 1, carries a plurality of chips of which only two chips 31 and 33 are shown. The thermally conductive plate is formed in two segments 35 and 37. This approach is particularly advantageous if more than one relatively high-power chips are installed on the substrate. A separate segment of the plate is soldered to each such high-power chip. Lower-powered chips that are adjacent to each high-powered chip are coupled to the same segment either by solder or by thermal paste as convenient.

Figure 3:
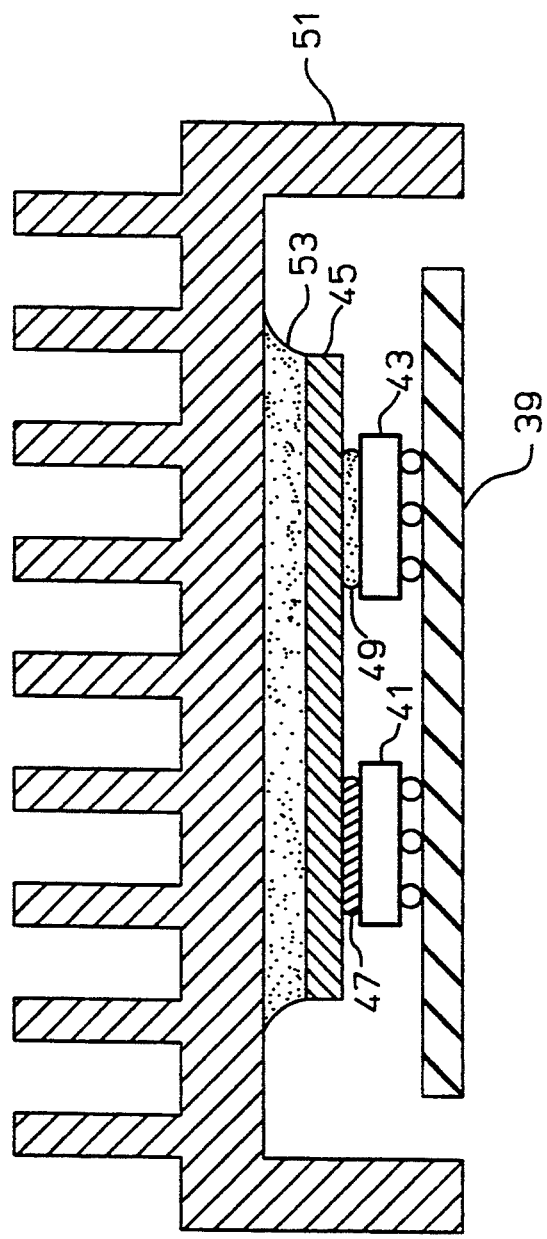
FIG. 3 is a cross-sectional view of a heat sink assembly similar to that shown in FIG. 1 but with thermal paste instead of indium solder between some of the chips and the thermally conductive plate.

All the chips in some MCMs are given metallized upper surfaces that bond readily with indium solder. Other MCMs have chips such as static RAMs which are not furnished with metallized surfaces. Thermal paste is used between such chips and the thermally conductive plate. An example of this is shown in FIG. 3. A substrate 39 carries a first chip 41 that bonds with indium solder and a second chip 43 that does not. A thermally conductive plate 45 is thermally coupled to the chip 41 with indium solder 47 and to the chip 43 with thermal paste 49. As in the embodiment of FIG. 1, a heat sink 51 is thermally coupled to the plate 45 with thermal paste 53. This approach is particularly advantageous if one high-power chip and several low-power chips are to be cooled. The high-power chip (for example, a microprocessor) is metallized to permit it to be soldered to the thermally conductive plate for maximum thermal conductivity. The low-power chips (for example, SRAMs) are not metallized and are coupled to the thermally conductive plate with thermal paste, which provides adequate thermal conductivity and absorbs any lateral movement, thereby protecting the solder bumps from mechanical stress.

Various means may be used to attach the MCM and the thermally conductive plate to the heat sink. One such means, the support plate 27, is depicted in FIG. 1. Screws (of which only one screw 55 is actually shown in the drawing) or other suitable fasteners are used to fasten the support plate to the heat sink. The support plate and the heat sink define a cavity 57 enclosing the multi-chip module and the thermally conductive plate.

Electrical conductors must be provided to connect the MCM with external circuitry. A flat flexible cable 59 that extends between the support plate 27 and the heat sink 23 may be used for this purpose. A microstrip flex circuit with a 50-ohm characteristic impedance, manufactured by Hughes Aircraft Co., is suitable; when this type of flex circuit is used, ground and power connections are provided by means of a split plane layer.

Figure 4:
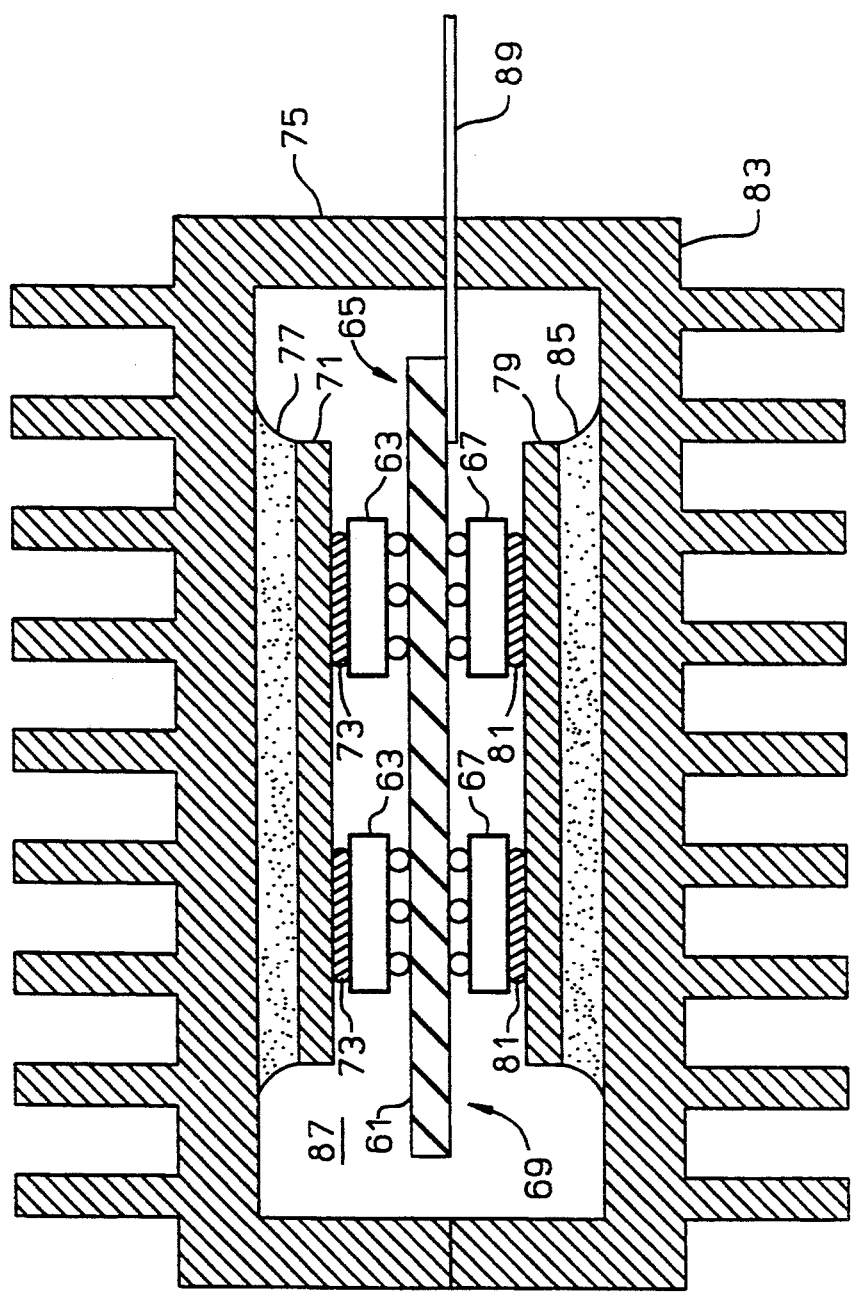
FIG. 4 is a cross-sectional view of a heat sink similar to that shown in FIG. 1 but for an MCM having chips on both sides of the substrate.

FIG. 4 illustrates an alternate embodiment that is adapted for an MCM with a substrate 61 that has one or more chips 63 on an upper surface 65 and more chips 67 on a lower surface 69. The chips 63 are thermally coupled to a first thermally conductive plate 71 through a first thermal interface 73 such as indium solder. The plate 71 is thermally coupled to a first heat sink 75 through a second thermal interface 77 such as thermal paste. Similarly, the chips 67 are thermally coupled to a second thermally conductive plate 79 through a third thermal interface 81 such as indium solder, and the plate 79 is thermally coupled to a second heat sink 83 through a second thermal interface 85 such as thermal paste. The first and second heat sinks 75 and 83 enclose the MCM and the two thermally conductive plates in a cavity 87. The heat sinks are mechanically fastened together by screws or other fasteners (not shown) as may be convenient. A flat cable 89 extends between the heat sinks to establish electrical connections with external circuitry.

From the foregoing it will be appreciated that the heat sink assembly provided by the invention provides an efficient thermally conductive path between the chips on an MCM and a heat sink. The assembly is mechanically simple, easy to assemble, and relatively easy to remove if it becomes necessary to service or rework the MCM. Mechanical stresses from lateral chip motion resulting from thermal effects such as differential expansion are minimized and other mechanical stresses are largely eliminated, thereby protecting the solder bump electrical connections between the chips and the substrate from premature failure.

Although certain embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

I claim:

1. A heat sink assembly, comprising
   a multi-chip module having a substrate and a plurality of integrated circuits mounted on a first surface of the substrate:
   a thermally conductive plate;
   a first thermal interface between a top surface of the integrated circuits and the thermally conductive plate, operative to conduct heat from the integrated circuits to the thermally conductive plate;
   a heat sink housing;
   a second thermal interface between the thermally conductive plate and the heat sink housing, operative to conduct heat from the thermally conductive plate to the heat sink housing; and
   clamping means for clamping the multi-chip module, the thermally conductive plate and the heat sink housing together, such that the multi-chip module and the thermally conductive plate are enclosed within a cavity formed by the heat sink housing and the clamping means.

2. A heat sink assembly as in claim 1 wherein the first thermal interface comprises indium.

3. A heat sink assembly as in claim 1 wherein the second thermal interface comprises thermal paste.

4. A heat sink assembly as in claim 1 wherein the thermally conductive plate comprises an alloy of copper and tungsten.

5. A heat sink assembly as in claim 1 wherein the thermally conductive plate comprises silicon carbide.

6. A heat sink assembly as in claim 1 wherein the thermally conductive plate comprises a plurality of segments.

7. A heat sink assembly as in claim 1, wherein the integrated circuits include chips having metallized top surfaces and chips not having metallized top surfaces, and wherein the first thermal interface comprises indium solder between the thermally conductive plate and the chips having metallized top surfaces and thermal paste between the thermally conductive plate and the chips not having metallized top surfaces.

8. A heat sink assembly as in claim 1 wherein the clamping means comprises a support plate and a fastener, the fastener couples the support plate to the heat sink housing, the support plate and the heat sink housing defining between themselves the cavity enclosing the multi-chip module and the thermally conductive plate.

9. A heat sink assembly as in claim 8 and further comprising a flat flexible cable extending between the support plate and the heat sink housing to establish electrical communications between the multi-chip module and an external circuit.

10. A heat sink assembly as in claim 1 and further comprising:

a second thermally conductive plate;

a third thermal interface between an integrated circuit mounted on a second side of the substrate and the second thermally conductive plate, operative to conduct heat from said integrated circuit to the second thermally conductive plate;

a second heat sink housing; and a fourth thermal interface between the second thermally conductive plate and the second heat sink housing, operative to conduct heat from the second thermally conductive plate to the second heat sink housing.

11. A heat sink assembly as in claim 10 wherein the clamping means comprises a fastener for fastening the first and second sink housings together, the first and second sink housings defining therebetween a cavity enclosing the multi-chip module and the two thermally conductive plates.

12. A heat sink assembly as in claim 10 wherein the third thermal interface comprises indium.

13. A heat sink assembly as in claim 10 wherein the fourth thermal interface comprises thermal paste.

14. A heat sink assembly as in claim 10 wherein the second thermally conductive plate comprises an alloy of copper and tungsten.

15. A heat sink assembly as in claim 10 wherein the second thermally conductive plate comprises silicon carbide.

16. A heat sink assembly as in claim 10 wherein the second thermally conductive plate comprises a plurality of segments.

17. A heat sink assembly as in claim 1 wherein the top surfaces of at least one of the integrated circuits is metallized.

* * * * *